United States Patent [19]
Reime et al.

[11] Patent Number: 5,719,518
[45] Date of Patent: Feb. 17, 1998

[54] VARIABLE ELECTRONIC RESISTOR HAVING PARALLEL PHASE-INVERTED VARIABLE SEMICONDUCTOR CHANNELS WITH COMMON CONTROL INPUT AND CURRENT-TO-VOLTAGE CONVERTERS

[75] Inventors: Gerd Reime, Schömberg; Andres Richter, Pforzheim, both of Germany

[73] Assignee: Nokia Technology GmbH, Pforzheim, Germany

[21] Appl. No.: 674,980

[22] Filed: Jul. 3, 1996

Related U.S. Application Data

[63] Continuation of Ser. No. 508,607, Jul. 28, 1995, abandoned, which is a continuation of Ser. No. 138,804, Oct. 15, 1993, abandoned.

[30] Foreign Application Priority Data

Oct. 22, 1992 [DE] Germany ............... 42 35 584.2

[51] Int. Cl.$^6$ ........................................ H03L 5/00
[52] U.S. Cl. ................. 327/308; 327/361; 330/254; 330/278
[58] Field of Search ........................ 307/242, 490, 307/491, 513; 330/144, 145, 278, 284, 254, 258; 327/362, 404, 427, 308, 361

[56] References Cited

U.S. PATENT DOCUMENTS

| | | | |
|---|---|---|---|
| 3,581,215 | 5/1971 | Meyer | 328/56 |
| 3,621,284 | 11/1971 | Cluett et al. | 327/308 |
| 4,155,047 | 5/1979 | Rubens et al. | 330/284 |
| 4,331,929 | 5/1982 | Yokoyama | 330/254 |
| 4,366,449 | 12/1982 | Sato | 330/278 |
| 4,929,908 | 5/1990 | Imanishi | 330/254 |
| 4,987,380 | 1/1991 | Ishikawa | 330/254 |
| 5,030,923 | 7/1991 | Arai | 330/254 |
| 5,172,068 | 12/1992 | Childs | 328/162 |

FOREIGN PATENT DOCUMENTS

| | | |
|---|---|---|
| 0052544 | 5/1982 | European Pat. Off. |
| 2900911 | 7/1979 | Germany |
| 3021788 | 12/1980 | Germany |
| 2950584 | 6/1981 | Germany |
| 4129334 | 3/1992 | Germany |

OTHER PUBLICATIONS

Steyaert; u.a.: High Frequency Saturated CMOS Floating Resistor for Fully-Differential analogue Signal Processors. In: Electronics Letters, 29.8. 1991, S.1609–1611.
Clarke, T.L.: FET pair an op amp linearize voltage-controlled resistor. In: Electronics, 28.4.1977, S. 111 u. 113.
Toumazou: u.a. Linear Tunable Resistance Circuit Using Gallium ArseniteMeseets. In: Electronics Letters, 11.4.1991, S.655–657.
H. Tietze, Ch. Schenk, "Halbleiter-Schaltungstechnik" Funfte, Uberarbeitete Auflage. Mit 821 Abbildungen Springer-Verlag Berlin Heidelbert New York 1980, pp. 91 and 92.

*Primary Examiner*—Timothy P. Callahan
*Assistant Examiner*—Jeffrey Zweizig
*Attorney, Agent, or Firm*—Ware, Fressola, Van Der Sluys & Adolphson LLP

[57] ABSTRACT

A variable electronic resistor (16), which can be varied by a control signal (Ust) at the control input (15), contains two parallel, signal paths (1 and 2) with identical components, of which one signal path carries a phase inverted input transmission signal and the other signal path carries a non phase inverted input transmission signal and which are additively joined at the output side. Each signal path contains a charge carrier channel (3) and a signal transmission stage (7) with a low impedance current input, located downstream of the output electrode (5) in the signal path of the charge carrier channel. The resistor of the charge carrier channel can be varied by a control voltage (Ust), which is common to both charge carrier channels, in a control electrode (14) of the semiconductor components (4).

5 Claims, 3 Drawing Sheets

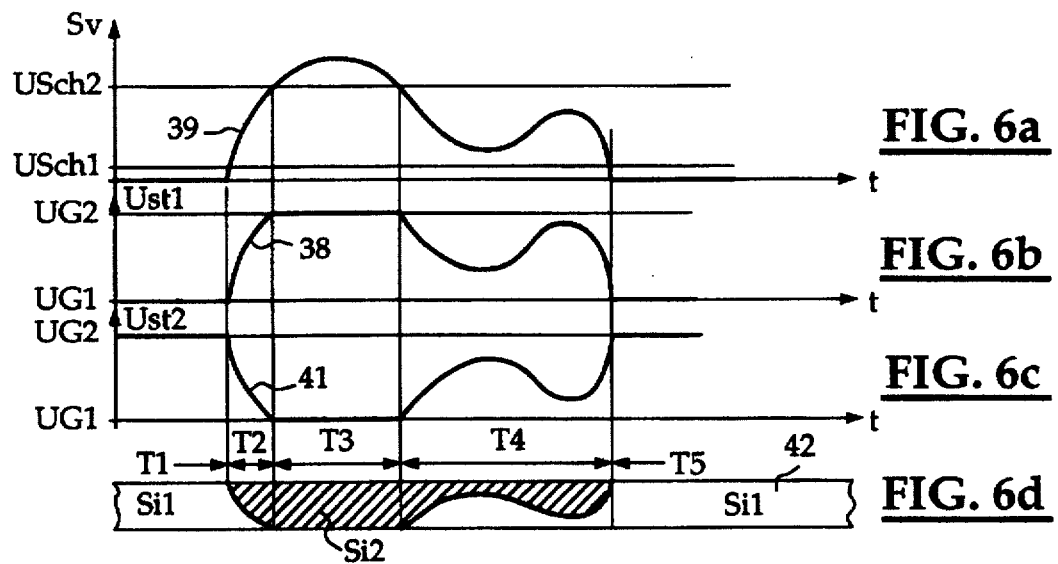
FIG. 6a
FIG. 6b
FIG. 6c
FIG. 6d
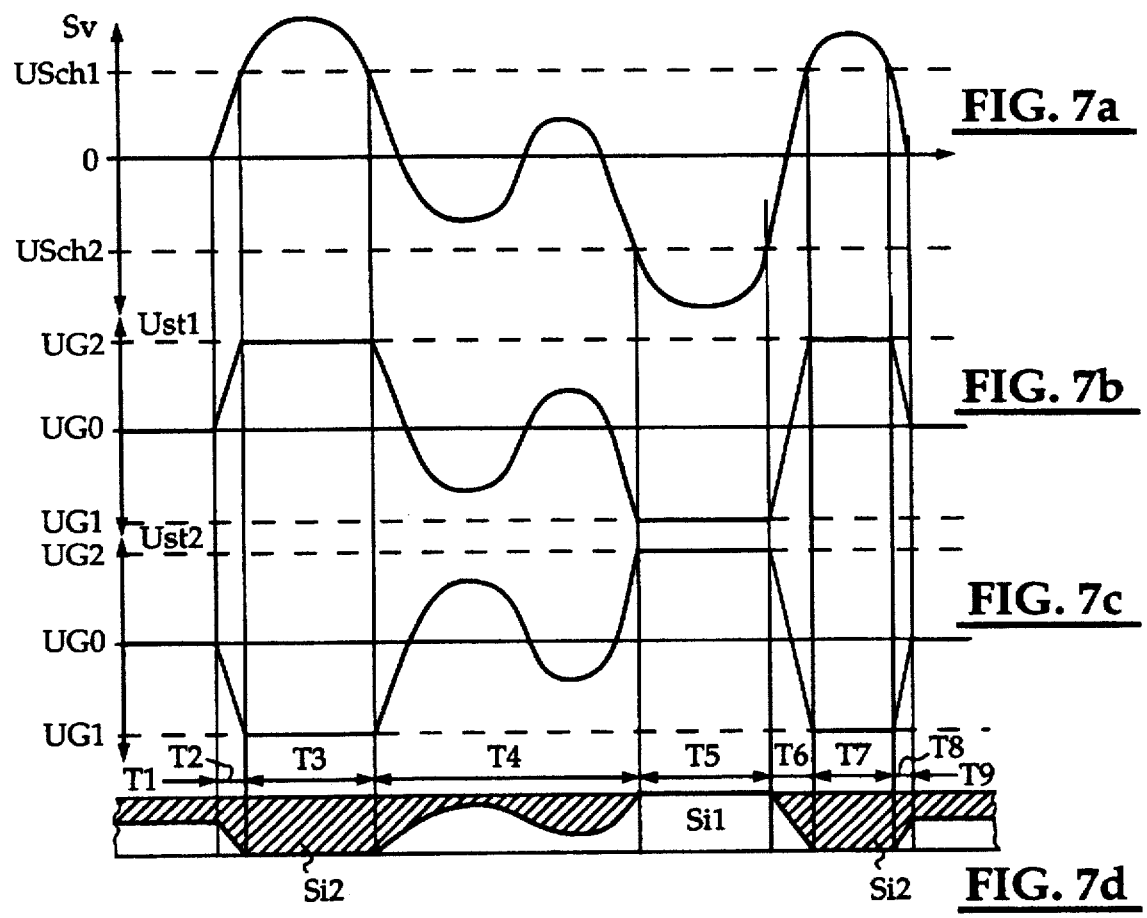
FIG. 7a
FIG. 7b
FIG. 7c
FIG. 7d

VARIABLE ELECTRONIC RESISTOR HAVING PARALLEL PHASE-INVERTED VARIABLE SEMICONDUCTOR CHANNELS WITH COMMON CONTROL INPUT AND CURRENT-TO-VOLTAGE CONVERTERS

This application is a continuation of application Ser. No. 08/508,607 filed on Jul. 28, 1995, which is a continuation of Ser. No. 08/138,804 filed on Oct. 15, 1993, both now abandoned.

TECHNICAL FIELD

The invention concerns a variable electronic resistor.

BACKGROUND OF THE INVENTION

It is often desirable to electronically imitate a variable resistor, a voltage divider or a potentiometer, i.e. to build it exclusively with semiconductors and in this way to forgo mechanical components. Field effect transistors are particularly well suited, which, with low drain source voltages, behave almost like ohmic resistors, whose magnitude can be altered within wide limits by means of the gate source voltage. Such an electronic resistor using a field effect transistor is described, for example, on pages 91 and 92 of the textbook "Semiconductor Circuit Technology" by U. Tietze, Ch. Schenk, published by Springer Berlin, 1980. The controllable voltage divider, described there in figure 5.20 and pertinent text, contains an ohmic resistor in the signal path, and the drain source path of a field effect transistor in the drain path. To compensate, at least partially, for the nonlinearity of the volume resistor in the drain source path of the field effect transistor, an equalizing resistor is connected between the tap point of the voltage divider and the control electrode of the field effect transistor, to compensate for the nonlinearity of the resistance curve of the drain source channel. However, this equalizing resistor creates a direct electrical connection from the control circuit to the working circuit of the variable electronic resistor, which is not always desirable. Although this feedback considerably increases the linearity of the selection range of the variable electronic resistor, about 1 Volt, it can, however, restrict the transmission limit frequency considerably by means of capacitance effects. Furthermore, in many instances, a wide control range also requires a large selection range, which the known circuit cannot provide.

On the other hand, the variable range of a voltage divider or a potentiometer is often not needed in the drain path, but in the signal path of a signal to be transmitted.

SUMMARY OF THE INVENTION

The invention has the task of developing a variable electronic resistor of the type cited in the beginning in such a way, that it can be directly located in the signal path of an electrical signal to be transmitted, and allows the transmission of a relatively large signal without distortion over a widely variable range according to the size of the ohmic resistor. This task has been fulfilled by a variable electronic resistor with variable charge carrier channels for semiconductor components, in which the volume resistor (Rk) of the charge carrier channel can be varied by a control signal (Ust) from a control electrode of the semiconductor component, and with an equalizing device to compensate for the nonlinearity of the resistance curve of the charge carrier channel within the control range, characterized by two parallel signal paths, which run at antiphase transmission signals and are added to each other at the output side, where the charge carrier channel of a semiconductor component, and a signal transmission stage with a low impedance current input, which is located downstream of the output electrode of the charge carrier channel, are placed in the two signal paths between the input side and the output side, where the control electrodes of both semiconductor components have their control signals joined at the control input.

By dividing the variable electronic resistor into two signal paths with identical components, which are added at the outlet, with one charge carrier channel each, whose resistance curve is selected, the type of arrangement of the phase inversion in both signal paths achieves a high linearity of the resistance curve resulting from the two signal paths over a very wide range of control and signal amplitude, which makes possible a high degree of freedom from distortion of the signal to be transmitted, over a wide control range. The input resistor of the signal transmission stage, downstream of the output electrode of the charge carrier channel that is switched into the signal path, is so small by comparison with the lowest variable resistance of the charge carrier channel, that it is of no consideration, and no feedback takes place, which can affect the control voltage. This circuit transforms the power signal in the charge carrier channels into the transmitted signal of a size corresponding to the current.

A variable electronic resistor in accordance with the invention can easily be produced as part of an integrated circuit.

It is particularly advantageous to use the drain source channel of a field effect transistor as the charge carrier channel. However, because of the especially advantageous curve compensation, the variable charge carrier channel of other semiconductor components, for example bipolar transistors, can be used as the variable resistor.

In a special configuration, an amplifier with antiphase outputs is used for the phase inversion at the input of one of the two signal paths, whose outputs are the inputs of the two signal paths. Accordingly, in an advantageous configuration, the two inputs of a circuit that forms a signal difference, are connected to the outputs of the two signal paths, which simultaneously cause the phase inversion by means of the difference, and perform the addition at the output of the two signal paths. Another advantageous configuration of phase inversions is performed by phase inverters, one of which is located in one of the signal paths before the input to the charge carrier channel located therein, and another phase inverter is located in the other signal path behind the signal transmission stage that is switched into the signal path.

In another configuration developed by the invention, adapter circuits are connected before the control electrodes of the semiconductor components with charge carrier channels in the signal paths, which are controlled by the control electrodes, where the adapter circuits change a control signal at the control input of the electronic resistor in such a way, that the electrical volume resistance of the charge carrier channel has a predetermined resistance value with at least one predetermined value of the control signal at the control input. This significantly extends the freedom from distortion and the level range of the signals to be transmitted.

If a charge carrier channel, which can be blocked by a control signal at the control electrode of the semiconductor components, is located in the two signal paths of the electronic resistor according to the invention, the electronic resistor can be used to advantage as a quick switch in the transmission path of a signal to be transmitted, for example a video signal. The phase inversion at the output side of the signal paths, with usually equal levels and delay time, almost entirely eliminates any interference signals transmitted in these two signal paths, which occur at the sides of the signals that switch the electronic resistor. In this instance, the switching process takes place through a first switching level of a switching signal located at the control input of the electronic resistor, which varies a predetermined minimum conducting-state DC resistance in each charge carrier channel located in the two signal paths, and represents a first limit value of the switching signal, and is so designed, that it is still fully positioned in the blocking range of the control electrode of the semiconductor component for controlling the charge carrier channel of the semiconductor component, but in the vicinity of the transition from the blocking range to the passing range, and through a second switching level of the signal at the control input, which represents a second signal limit value, and is designed to set a blocking condition of the channel in each charge carrier channel. Among others, such an electronic switch has the advantage, that the switching process is analog along the circuit side with a finite rising time, so that the switching process is soft or even follows a special switching curve without being shocklike. It is also advantageous that slower switching processes, with control signal values that stay within the range of both signal value limits, take place in accordance with the control signal.

BRIEF DESCRIPTION OF THE DRAWINGS

The following explains the invention in more detail by means of advantageous configuration examples. In the pertinent drawings:

FIGS. 6 and 7 are each the diagrams a), b) and c) of the curve process of the control signals on the input and the output side of the control signal circuit for the fader circuit shown in FIG. 5 and one diagram d) each of the fader ratio of the transmitted signals.

BEST MODE FOR CARRYING OUT THE INVENTION

Figure 1:
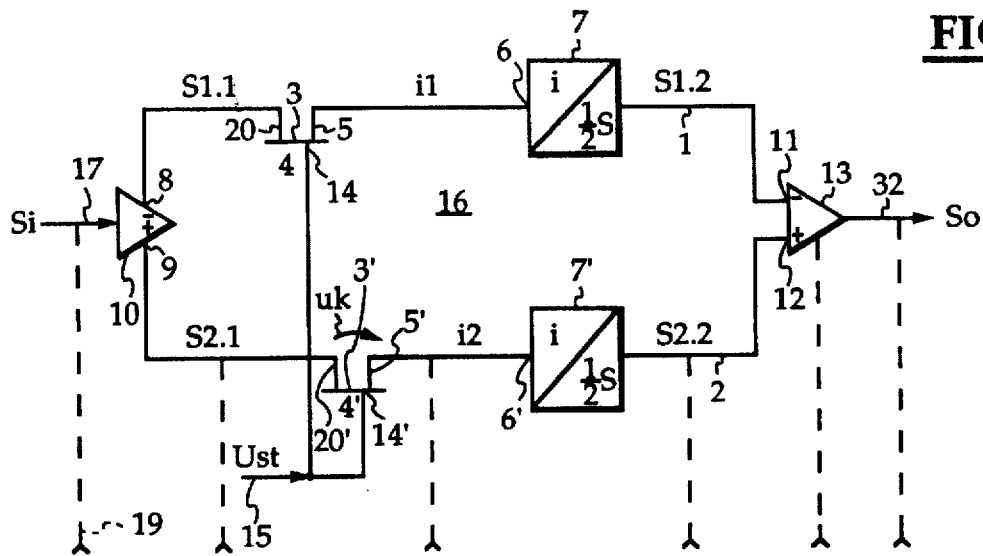
FIG. 1 is a block circuit of a variable electronic resistor with an amplifier on the input side with antiphase outputs, and a differential amplifier on the output side.
Figure 2:
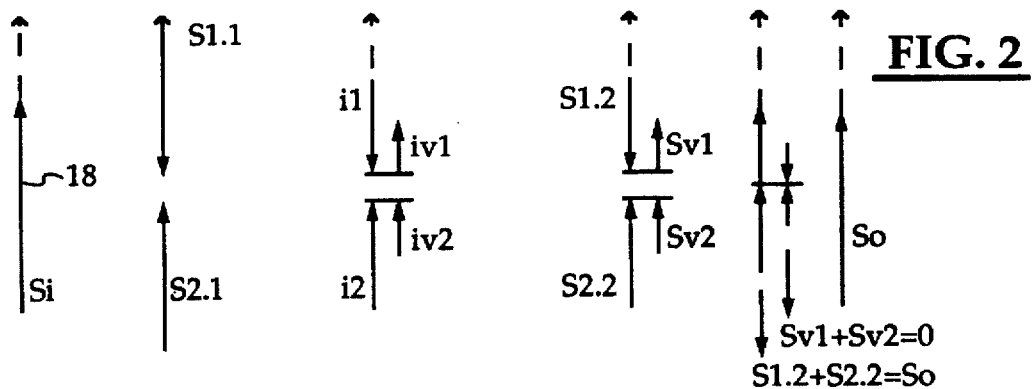
FIG. 2 is an arrow diagram of the immediate signal level and signal directions of the areas indicated in FIG. 1.

FIG. 1 depicts the block circuit diagram of a variable electronic resistor. The variable electronic resistor comprises two signal paths 1 and 2 in parallel to each other, and which are identical with respect to their circuit construction. The charge carrier channels 3,3' of semiconductor components 4,4' are connected to each signal path, in the configuration example it is the drain source path of a field effect transistor. The low impedance power inputs 6,6' of a current-voltage converters 7,7' are connected into the signal path, downstream of the output electrode 5 of the charge carrier channel. On the input side, the two signal paths 1 and 2 are connected to the antiphase outputs 8 and 9 of an amplifier 10. On the output side, the two signal paths are connected to the differential inputs 11 and 12 of a differential amplifier 13. The control inputs 14,14' of the two semiconductor components 4,4' for varying the resistance value of the charge carrier channel 3,3' of the semiconductor components 4,4', are connected in parallel and together form the control input 15 of variable electronic resistor 16. A transmission signal Si is present at the signal input 17 of the amplifier 10 on the input side, for which the variable electronic resistor 16 is being used. The momentary value of its level and its phase direction are shown by arrow 18 in the arrow diagram in FIG. 2. The arrows of the arrow diagram in FIG. 2 schematically represent the level and the phase of the transmission signal Si characterized by arrow 18 on the input side, during the transmission of this signal in signal paths 1 and 2 of the variable electronic resistor, at the places indicated by the dashed lines 19. The arrows are identified with the markings of the transmitted signal in the corresponding places. In the depicted configuration example, the amplifier 10 transmits an inverted transmission signal Si with an amplification 1 to the output 8 and a noninverted transmission signal Si with an amplification 1 to the output 9. The output resistance of the two outputs 8 and 9 of amplifier 10 is so low, that it does not impair the control process of the variation of the volume resistor of charge carrier channel 3,3' in the two signal paths. A predetermined control voltage Ust, at the control input 15 of the variable electronic resistor 16, produces a certain conducting-state DC resistance Rk in the charge carrier channel 3,3' of semiconductor components 4,4' which additionally depends on the channel voltage uk produced in the charge carrier channel between its electrodes 20,20' and its output electrodes 5,5'. The channel resistor Rk is therefore a function of control voltage Ust and the channel voltage uk.

This channel resistor Rk, whose function Rk=f(Ust, Uk) is not shown in detail in the configuration example, produces a signal current i1 or i2 from the output signals S1.1 and S1.2, that corresponds to these signals, on which the transmission distorting signal current iv1 or iv2 are superimposed, due to the additional dependency of the channel resistor Rk on the signal-dependent, direct-axis voltage component Uk in the charge carrier channel 3,3'. The low impedance power inputs 6,6' of the current-voltage converters 7,7' that is connected downstream of the output electrodes 5,5' of the charge carrier channels 3,3', is designed and constructed so that no input voltage occurs therein, which would affect the control voltage Ust in control electrode 14,14' of the semiconductor components 4,4'. The current-voltage converter 7 converts the input power signals i1+iv1 or i2+iv2 into a transmission signal S1.2+Sv1 or S2.2+Sv2, which corresponds to the transmission signal Si on the input side, whose magnitude in the depicted configuration example is proportional to the power i1+iv1 or i2+iv2 at the input side. In the arrow diagram of FIG. 2, this signal for the two signal paths is illustrated by arrows, which are identified as S1.2 and S2.2. Aside from these level arrows S1.2 and S2.2, the transmission signals Sv1 and Sv2, which are produced in the charge carrier channels 3,3' and distort the transmission signals, are also shown as arrows. These signals, which distort the transmission, have the same phase in both signal paths 1 and 2, so that they nearly cancel each other during the formation of the difference in the differential amplifier 13, while the antiphase transmission signals are added during the formation of the difference in the differential amplifier 13, and form the output signal So with an amplification 1 of the differential amplifier in the illustrated configuration example.

In this way an undistorted output signal So is created in the variable electronic resistor 16, which corresponds to the transmission signal Si at the input side, and whose level corresponds to a not shown curve of control signal Ust at the control input 15 of the variable electronic resistor 16.

Figure 3:
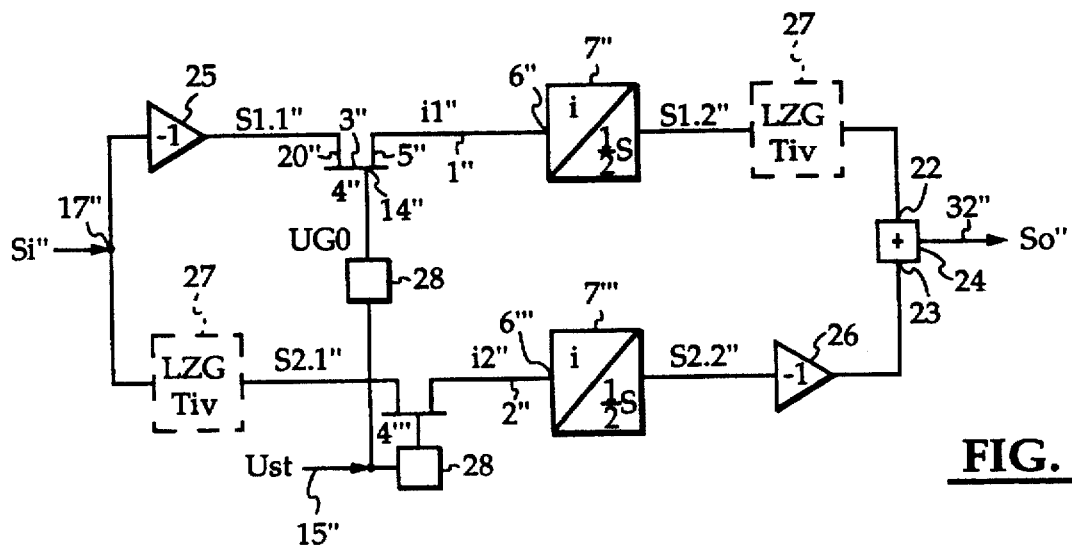
FIG. 3 is another block diagram of a variable electronic resistor with a phase inverter in each signal path.

FIG. 3 shows another configuration example of a block circuit diagram of another variable electronic resistor with two signal paths 1" and 2", which are added to each other at the output side by the signal inputs 22 and 23 of a signal addition circuit 24. In the same manner and with the same functional properties as the configuration example in FIG. 1, each of the two signal paths contains a charge carrier channels 3",3'" of a semiconductor component 4, and a current-voltage converters 7",7'", connected downstream of the output electrode 5",5'" of the charge carrier channel in the signal path. The volume resistor Rk of the charge carrier channel for a signal to be transmitted, is controlled by a common control signal Ust at both control electrodes 14", 14'" of the two semiconductor components 4",4'", in the same way as in the configuration example illustrated in FIG. 1.

In the configuration example shown in FIG. 3, an adapter circuit 28 is connected upstream of the control electrodes 14",14'" of the semiconductor components 4",4'" in signal paths 1" and 2", which is so adjusted that, at a predetermined control voltage Ust0 of the control signal Ust at the input 15" of the variable electronic resistor, the electrical volume resistance of the charge carrier channel 3",3'" has a predetermined impedance Rk0. This is shown in detail in FIG. 4. It shows the process of the conducting-state DC resistor Rk of each charge carrier channel 3",3'" located in the signal path, through the axis of the voltage Ust of the control path of semiconductor components 4",4'", which depends on this control voltage, and the process of the current Ik of the same dependency, flowing through this charge carrier channel. Two limit values UG1 and UG2 are indicated on the control voltage axis Ust, through which the control voltage in control electrode 14 is varied, to control the conducting-state DC resistance Rk of charge carrier channel 3". The curent-voltage signal converters 7",7'" are adjusted in such a way that, with the limit value UG1 of the control voltage, they produce a signal level at their output for the smallest conducting-state DC resistance of the charge carrier channel, which is equal to half the signal level of the transmission signal at the input of the variable electronic resistor. In the illustrated configuration example, the predetermined resistance Rk0, for which the charge carrier channel 3",3'" is to be varied at a predetermined control voltage Ust0 at input 15, is the resistance value at which the channel current Ik assumes half the value of the maximum variable channel current Ik1, and at which the current-voltage converter 7 produces an output level S.2, which is equal to ¼ of the input level Ui of the electronic resistor. The adapter circuit 28 is then adjusted, so that it produces a control signal UG0 at a predetermined control signal level Ust0, which sets this predetermined resistance value Rk0 of the conducting-state DC resistance of charge carrier channel 3",3'" in the controlled semiconductor component 4",4'".

In contrast to the variable electronic resistor shown in FIG. 1, the variable electronic resistor in FIG. 3 contains a phase inverter 25 before the input electrode 20 of charge carrier channels 3", which is connected to the signal path 1", to invert the phase of the input side between the two signal paths 1" and 2", and a phase inverter 26 to invert the phase of the output side of the two signal paths 1" and 2", which is connected to the other signal path, downstream of current-voltage converters 7",7'" located therein. This arrangement of phase inverters 25 and 26 in signal paths 1" and 2" of the variable electronic resistor, balances any potential phase errors of phase inverters 25 and 26, which could affect the addition in the signal addition circuit 24. The running time delays Tiv, caused by the phase inverters connected into the signal lines, could cause the addition in the signal addition circuit 24 at the variable electronic resistor output, to produce an incomplete compensation of the distortion signals. For that reason, a running time element 27 is connected into the other signal path, at the location corresponding to the on-switch of the phase inverter, which contains the same running time delay Tiv as the opposing phase inverter 25 or 26.

Signals that correspond to the same configuration examples are identified by the same references.

The signals Si, transmitted by the variable electronic resistor, are voltage signals for example.

Figure 4:
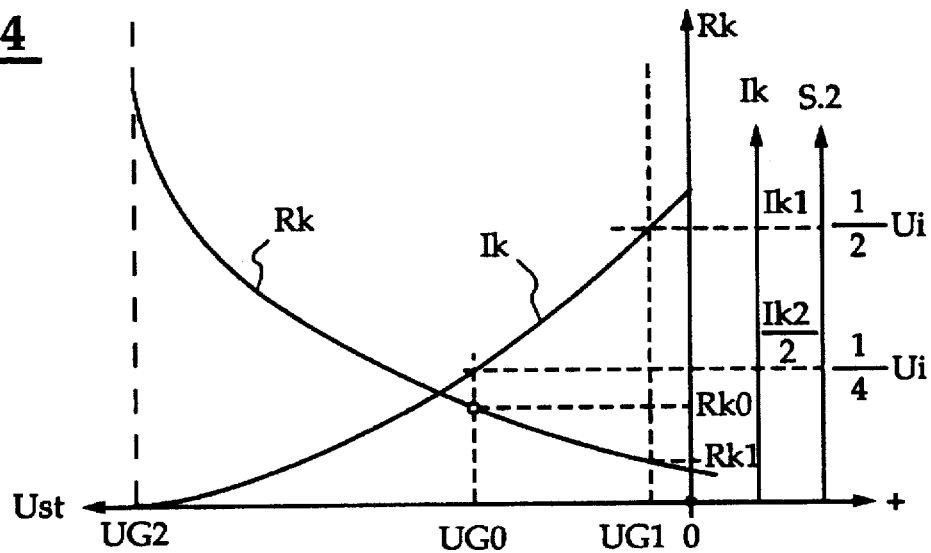
FIG. 4 is a diagram of the volume resistance process of the charge carrier channel and the channel current as a function of the control voltage to the semiconductor components that are connected into the signal paths.

Variable electronic resistors, particularly of the type described in FIGS. 1 and 3, can also be utilized as electronic signal switches in signal transmission channels. To that effect, a switching voltage Sv with two switching levels USch1 or USch2 are placed at the control input 15 of the variable electronic resistor, instead of the control signal Ust with a variable control voltage. These switching voltages produce, either directly or through the adapter circuits 28, level values at the control electrode 14 of the semiconductor components 4",4'" connected in the signal paths 1" and 2", which are equal to the two signal limit values UG1 and UG2. The signal limit value UG1, corresponding to the first switching level USch1, is designed to be located entirely in the blocking area of the control path, for control of the charge carrier channel 3",3'" of semiconductor components 4", 4'", but in the vicinity of the transition from the blocking area to the passing range of the path of the control electrode of the semiconductor component, and sets the conducting-state DC resistance Rk of the charge carrier channel in such a way, that the transmission signal Si, which is located at the signal input 17 of the variable electronic resistor, is transmitted without loss of level to the signal output 32 of the variable electronic resistor. In this manner the control source is not charged and the charge carrier channel is not additionally affected by a control current. The second switching level USch2 of the switching signal located at the input 15" is so designed, that a second signal limit value UG2 takes place at the control electrode 14" of semiconductor component 4",4'", at which the blocking condition of the charge carrier channel of the semiconductor components that are switched into the signal paths 1" and 2", enters into the blocking condition (FIG. 4). The switch-over process of switching signal Ust from the first switching level USch1 to the second switching level USch2 takes place along a circuit side within a small time period, namely the time of the switching process.

The transmission signal Si follows this timed flank process, when this transmission signal is switched on or off by the variable electronic resistor. This prevents most switching bottlenecks in other instances of interrupted transmission signals. In addition, during a slow switching process, such a signal switch prevents distortion signals on the circuit side of the switching signal from causing a kind of bouncing of the signal switch, which would result in a back and forth switching of the signal switch in accordance with the random noise on the circuit side, and would considerably distort the signal to be transmitted.

Figure 5:
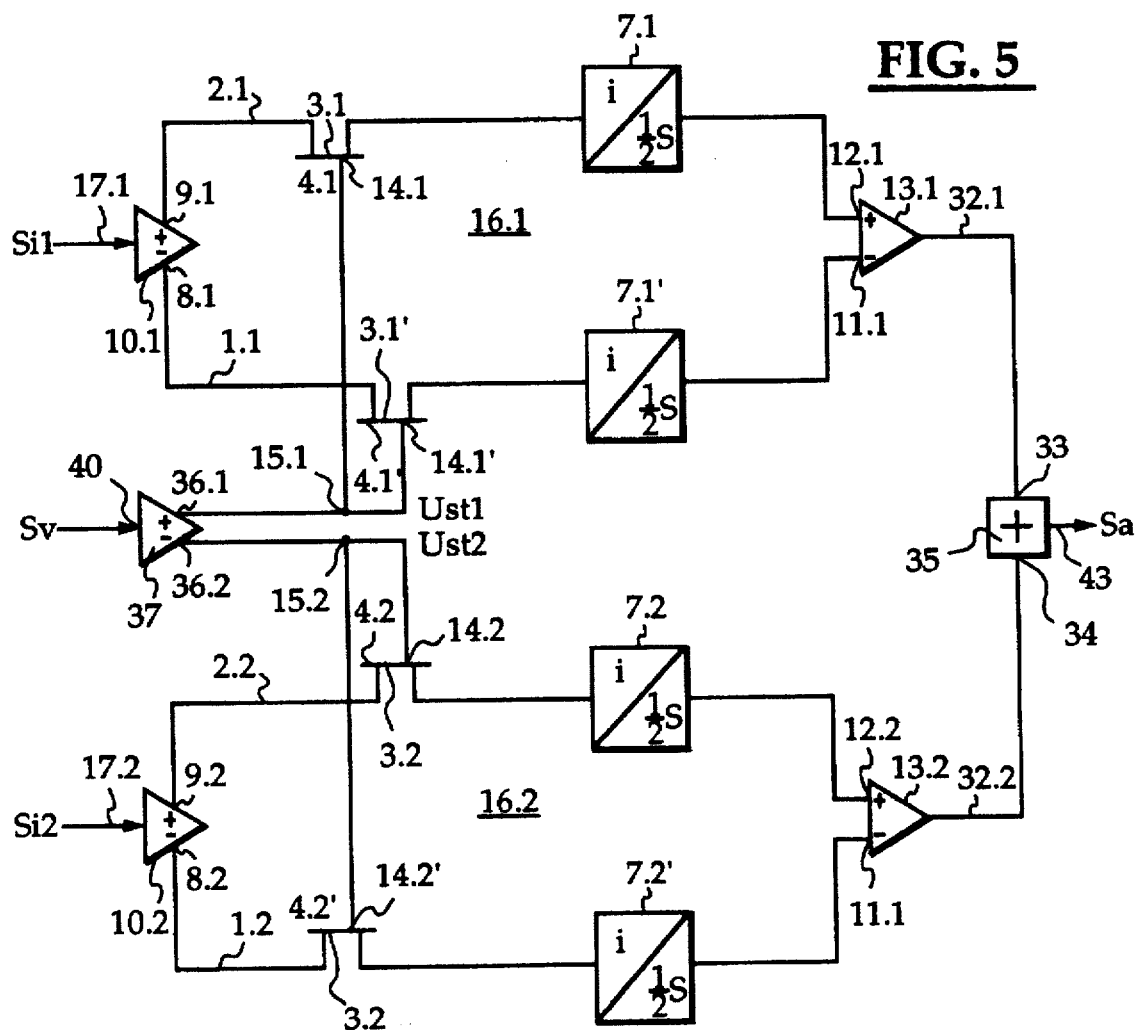
FIG. 5 is a block diagram of a signal fader circuit containing two variable electronic resistors.

FIG. 5 represents a block circuit diagram of a signal fader circuit with two variable electronic resistors 16.1 and 16.2, which are additively connected to a signal addition circuit 35 at the output side through signal inputs 33 and 34. The two variable electronic resistors 16.1 and 16.2 are identical and correspond essentially to the configuration example of a variable electronic resistor in FIGS. 1 and 3. Coincident components and assemblies are identified with the same references in both figures. A signal Si1 and Si2 to be transmitted is located at each of the signal inputs 17 of the two variable electronic resistors. Each of the control inputs 15.1 and 15.2 of the two variable electronic resistors 16.1 and 16.2 is connected to the signal outputs 36.1 and 36.2 of a signal circuit 37, for controlling and switching the two variable electronic resistors of the signal fader circuit. In the configuration example in FIG. 5, the signal outputs 36.1 and 36.2 immediately deliver the control signals Ust1 and Ust2 for control of the required volume resistance of charge carrier channels 3.1, 3.1', 3.2, 3.2' in the semiconductor components 4.1, 4.1', 4.2, 4.2', which are switched into signal paths 1.1, 1.2, 2.1, 2.2.

In the signal fader circuit shown in FIG. 5, the control signal circuit 37 is constructed in such a way, that the control signal Ust1 produced at the first control signal output 36.1, whose process 38 is shown in diagram b) of FIG. 6, follows the process 39 of the adjusting signal Sv, located at the signal input 40 of control signal circuit 37, and which is described in diagram a) of FIG. 6, which moves away from a first signal limit value UG1 to a second signal limit value UG2, and does not exceed this limit value, and from which simultaneously the control voltage signal Ust2, produced at the second control signal output 36.2 of control signal circuit 37, in a process 41 shown in diagram c) of FIG. 6, also follows the process 39 of adjusting signal Sv and moves away from the second signal limit value UG2 to the first signal limit value UG1, while not falling below this signal limit value UG1.

As mentioned earlier, these two signal limit values UG1 and UG2, which limit the control signal Ust at the control electrode 14.1, 14.1", 14.2, 14.2' of the semiconductor components 4.1, 4.1', 4.2, 4.2", are explained in the diagram of FIG. 4 and in the pertinent text. In the band 42 of diagram d) in FIG. 6, which schematically represents the output signal So at output 43 of the signal adding circuit 35 on the output side of the signal fader circuit, the portions of both transmission signals Si1 (white) and Si2 (dark shaded) are schematically represented in the output signal So. Only the first input side signal Si1 is transmitted to the output 43 of this arrangement during the time periods T1 and T5. During the time period T3, only the second input side signal Si2 is transmitted to output 43. During time period T2, a soft switching takes place from the transmission of the first input side signal Si1 to the second input side signal Si2. During the time period T4, both input signals Si1 and Si2 are transmitted to output 43 of the signal fader circuit with different mixtures of the signal. Such an arrangement permits to adapt the switch-over and fader processes between the two signals to be transmitted, to the required conditions.

In another advantageous configuration example, the control signal circuit 37 of the signal fader circuit shown as an example in FIG. 5, is additionally configured so that, when no adjusting signal Sv is present at its signal input 40, it produces a control signal at its two control signal outputs 36.1 and 36.2, which always has the same signal level UG0, which is between the first and the second limit value UG1 and UG2 of the control signal, and is designed in the illustrated configuration example, so that each variable electronic resistor 16.1 and 16.2 of the signal fader circuit transmits the transmission signal Si1 and Si2, located at its input 17, with half the level value at the input side, so that an output signal So with the same portion of both transmission signals Si1 and Si2 at the input side, is produced at the output 43 of the addition circuit 35 on the output side. To explain this circuit configuration, diagram a) in FIG. 7 shows the process of an adjusting signal Sv at the signal input 40 of control signal circuit 37, and diagrams b) and c) in FIG. 7 show the process of level Ust1 and Ust2 of the output signals of control signal circuit 37. The band in diagram d) of FIG. 7 again represents the portions of the transmission signals Si1 and Si2, on the input side, in output signal So at the output 43 of the addition circuit 35 on the output side of the signal fader circuit. During the time periods T1 and T9, in which no adjusting signal Sv is present at the signal input 40 of control signal circuit 37, one half of the transmission signals Si1 and Si2 at the input side, are transmitted to output 43 of the signal fader circuit. During time period T2, the switch-over is soft to the only transmission of the second transmission signal Si2. During time period T4, both transmission signals on the input side are transmitted alternately, following the process of the adjusting signal, to output 43, and during time period T5, only the first transmission signal Si1 to the output 43 of the signal fader circuit. During time period T6, a soft switch-over takes place from the transmission of the first transmission signal Si1 to the only transmission of the second transmission signal Si2 on the input side, during time period T7. During time period T8, a soft transition takes place to the idle condition of the control signal circuit 37, by transmitting both transmission signals Si1 and Si2 in equal portions on the input side.

We claim:

1. A variable electronic resistor with variable charge carrier channels (3, 3') for semiconductor components (4, 4'), in which a volume resistor (Rk) of the variable charge carrier channels (3, 3') can be varied by a control voltage signal ($U_{st}$) from control electrodes (14, 14') of the semiconductor components (4, 4'), and with an equalizing device to compensate for a nonlinearity of a resistance curve of the variable charge carrier channels (3, 3') within a control range, comprising:

(a) an inverter/noninverter circuit (10, 25), responsive to an input transmission signal (Si) for providing a phase inverted transmission voltage signal (S1.1) and a non-phase inverted transmission voltage signal (S2.1);

(b) a first signal path circuit (1) having semiconductor means (4) with a single variable charge carrier channel (3) and a control electrode input (14), responsive to the phase inverted transmission voltage signal (S1.1), for providing an amplitude controlled phase inverted current signal (i1), also having a current-to-voltage converter circuit (7) arranged downstream of the charge carrier channel (3) with a low impedance current input (6) connected in series with the variable charge carrier channel (3) for reducing the influence of the phase inverted transmission signal voltage (S1.1) superimposed on the control voltage signal $U_{st}$, responsive to the amplitude controlled phase inverted current signal (i1), for providing an amplitude controlled phase inverted transmission voltage signal (s1.2);

c) a second signal path circuit (2) being connected in parallel to and having substantially identical components as the first signal path (1), having corresponding semiconductor means (4') with a corresponding single variable charge carrier channel (3'), add a corresponding control electrode input (14') connected in parallel with the control electrode input (14) of the first signal path circuit (1) to a common control input (15), responsive to the non-phase inverted transmission voltage signal (S2.1), for providing an amplitude controlled non-phase inverted current signal (i2), also having a corresponding current-to-voltage converter circuit (7') arranged downstream of the corresponding variable charge carrier channel (3') with corresponding low impedance current input (6') connected in series with the corresponding variable charge carrier channel (3') for reducing the influence of the non-phase inverted transmission voltage signal (S2.1) superimposed on the control voltage signal U., responsive to the amplitude controlled non-phase inverted current signal (i2), for providing an amplitude controlled non-phase inverted transmission voltage signal (S2.2), said first signal path circuit (1) and said second signal path circuit (2) having phase inversions with a substantially equal level and delay time;

(d) means (13) for combining the amplitude controlled phase inverted transmission voltage signal (S1.2) and the amplitude controlled non-phase inverted transmission voltage signal (S2.2), for providing a transmission output signal (So); and an adapter circuit (28) for adapting the resistance curve of the variable charge carrier channels (3, 3') of the semiconductor components (4, 4'), connected between the common control input (15) of the variable electronic resistor and the control electrode (14) of the semiconductor components (4, 4') in each of the signal paths (1, 2), in such a way, that the volume resistor (Rk) of the variable charge carrier channels (3, 3') has a predetermined resistance value (Rk0) at least at one predetermined value (UG0) of a control signal that is present at the common control input (15).

2. A variable electronic resistor with variable charge carrier channels (3, 3') for semiconductor components (4, 4'), in which a volume resistor (Rk) of the variable charge carrier channels (3, 3') can be varied by a control voltage signal ($U_{st}$) from control electrodes (14, 14') of the semiconductor components (4, 4'), and with an equalizing device to compensate for a nonlinearity of a resistance curve of the variable charge carrier channels (3, 3') within a control range, comprising:

(a) an inverter/noninverter circuit (10, 25), responsive to an input transmission signal (Si), for providing a phase inverted transmission voltage signal (S1.1) and a non-phase inverted transmission voltage signal (S2.1);

(b) a first signal path circuit (1) having semiconductor means (4) with a single variable charge carrier channel (3) and a control electrode input (14), responsive to the phase inverted transmission voltage signal (S1.1), for providing an amplitude controlled phase inverted current signal (i1), also having a current-to-voltage converter circuit (7) arranged downstream of the charge carrier channel (3) with a low impedance current input (6) connected in series with the variable charge carrier channel (3) for reducing the influence of the phase inverted transmission signal voltage (S1.1) superimposed on the control voltage signal $U_{st}$, responsive to the amplitude controlled phase inverted current signal (i1), for providing an amplitude controlled phase inverted transmission voltage signal (S1.2);

c) a second signal path circuit (2) being connected in parallel to and having substantially identical components as the first signal path (1), having corresponding semiconductor means (4') with a corresponding single variable charge carrier channel (3'), and a corresponding control electrode input (14') connected in parallel with the control electrode input (14) of the first signal path circuit (1) to a common control input (15), responsive to the non-phase inverted transmission voltage signal (S2.1), for providing an amplitude controlled non-phase inverted current signal (i2), also having a corresponding current-to-voltage converter circuit (7') arranged downstream of the corresponding variable charge carrier channel (3') with corresponding low impedance current input (6') connected in series with the corresponding variable charge carrier channel (3') for reducing the influence of the non-phase inverted transmission voltage signal (S2.1) superimposed on the control voltage signal $U_{st}$, responsive to the amplitude controlled non-phase inverted current signal (i2), for providing an amplitude controlled non-phase inverted transmission voltage signal (S2.2), said first signal path circuit (1) and said second signal path circuit (2) having phase inversions with a substantially equal level and delay time; and (d) means (13) for combining the amplitude controlled phase inverted transmission voltage signal (S1.2) and the amplitude controlled non-phase inverted transmission voltage signal (S2.2), for providing a transmission output signal (So);

wherein a minimum volume resistance (Rk1) is varied by a first switching level (USch1) of a control signal present at the control input (15) of the electronic resistor, for each of the charge carrier channels (3, 3') located in the first and second signal path circuits (1, 2), where the first switching level (Usch1) of the switching signal for this adjustment corresponds to a first signal limit value (UG1) of the control voltage signal (Ust) at the control electrode (14, 14'), and is still fully in the blocking range in the vicinity of the transition from the blocking range to the passing range of the control path of the control electrode input (14, 14') Of the semiconductor component (4, 4'), for control of the variable charge carrier channel (3, 3') of the semiconductor component(4, 4'), and a second blocking condition is controlled by a second switching level (USch2) of the switching signal present at the control signal input (15) of each of the variable charge carrier channels (3, 3') located in the first and second path circuits (1, 2) where the second switching level corresponds to a second signal limit value (UG2) of a control signal present at the control electrode (14, 14') at which the controlled charge carrier channel (3, 3') is now blocked.

3. A variable electronic resistor also referred to as a first variable resistor (16.1) with variable charge carrier channels (3, 3') for semiconductor components (4, 4'), in which a volume resistor (Rk) of the variable charge carrier channels (3, 3') can be varied by a control voltage signal ($U_{st}$) from control electrodes (14, 14') of the semiconductor components (4, 4'), and with an equalizing device to compensate for a nonlinearity of a resistance curve of the variable charge carrier channels 43, 3') within a control range, comprising:

(a) an inverter/noninverter circuit (10, 25), responsive to an input transmission signal (Si), for providing a phase inverted transmission voltage signal (S1.1) and a non-phase inverted transmission voltage signal (S2.1);

(b) a first signal path circuit (1) having semiconductor means (4) with a single variable charge carrier channel (3) and a control electrode input (14), responsive to the phase inverted transmission voltage signal (S1.1), for providing an amplitude controlled phase inverted current signal (i1), also having a current-to-voltage converter circuit (7) arranged downstream of the charge carrier channel (3) with a low impedance current input (6) connected in series with the variable charge carrier channel (3) for reducing the influence of the phase inverted transmission signal voltage (S1.1) superimposed on the control voltage signal $U_{st}$, responsive to the amplitude controlled phase inverted current signal (i1), for providing an amplitude controlled phase inverted transmission voltage signal (S1.2);

c) a second signal path circuit (2) being connected in parallel to and having substantially identical components as the first signal path (1), having corresponding semiconductor means (4') with a corresponding single variable charge carrier channel (3'), and a corresponding control electrode input (14') connected in parallel with the control electrode input (14) of the first signal path circuit (1) to a common control input (15), responsive to the non-phase inverted transmission voltage signal (S2.1), for providing an amplitude controlled non-phase inverted current signal (i2), also having a corresponding current-to-voltage converter circuit (7') arranged downstream of the corresponding variable charge carrier channel (3') with corresponding low impedance current input (6') connected in series with the corresponding variable charge carrier channel (3') for reducing the influence of the Don-phase inverted transmission voltage signal (S2.1) superimposed on the control voltage signal $U_{st}$, responsive to the amplitude controlled non-phase inverted current signal (i2), for providing an amplitude controlled non-phase inverted transmission voltage signal (S2.2), said first signal path circuit (1) and said second signal path circuit (2) having phase inversions with a substantially equal level and delay time; and d) means (13) for combining the amplitude controlled phase inverted transmission voltage signal (S1.2) and the amplitude controlled non-phase inverted transmission voltage signal (S2.2), for providing a transmission output signal (So); and further comprising a second variable resistor structurally substantially similar to the first variable resistor (16.1), the first and second variable resistors (16.1, 16.2) for transmitting two transmission signals (Si1, Si2), of which one transmission signal (Si1) is placed at the signal input (17.1) of the first electronic resistor (16.1), and the other signal (Si2) is placed at the signal input (17.2) of the second variable resistor (16.2), also further comprising:

a signal adder (35) on the output side, where the outputs (32.1, 32.2) of the first and second variable resistors (16.1, 16.2) are connected respectively to inputs (33, 34), and a control signal circuit (37) having two control signal outputs (36.1, 36.2), to which the control signal inputs (15.1, 15.2) of the first and second variable resistors (16.1, 16.2) are connected, for the emission of control signals (Ust1, Ust2) which follow a waveform (39) of a variable signal (Sv) at a signal input (40) of the control signal circuit (37), the control signal input (15.1) at one control signal output moving to a first limit value (UG1) according to the waveform (39) of a variable signal (Sv), which is designed to be still fully within a blocking range in the vicinity of the transition from the blocking range to the passing range of the control path of the control electrode (14.1, 14.1') of the semiconductor components (4.1, 4.1'), for the control of the charge carrier channels (3.1, 3.1') in signal paths (1.1, 2.1) of the first variable resistor (16.1), and the control signal input (15.2) of the other control signal output simultaneously follows the waveform (39) of a variable signal (Sv) and moving to a second signal limit value (UG2), at which the charge carrier channels (3.2, 3.2'), located in the signal paths (1.2, 2.2) of the second variable resistor (16.2), are now blocked.

4. A signal fading circuit as in claim 3, characterized in that the control signals (Ust1, Ust2) at the two control signal outputs (36.1, 36.2) of the control signal circuit (37), with an input signal (Sv) of zero, has the same signal level, whose value (UG0) is between the level of the control signal of the first signal limit value (UG1) and the second signal limit value (UG2).

5. A variable electronic resistor with variable charge carrier channels (3, 3') for semiconductor components (4, 4'), in which a volume resistor (Rk) of the variable charge carrier channels (3, 3') can be varied by a control voltage signal ($U_{st}$) from control electrodes (14, 14') of the semiconductor components (4, 4'), and with an equalizing device to compensate for a nonlinearity of a resistance curve of the variable charge carrier channels (3, 3'within a control range, comprising:

(a) an inverter/noninverter circuit (10, 25), responsive to an input transmission signal (Si), for providing a phase inverted transmission voltage signal (S1.1) and a non-phase inverted transmission voltage signal (S2.1);

(b) a first signal path circuit (1) having semiconductor means (4) with a single variable charge carrier channel (3) and a control electrode input (14), responsive to the phase inverted transmission voltage signal (S1.1), for providing an amplitude controlled phase inverted current signal (i1), also having a current-to-voltage converter circuit (7) arranged downstream of the charge carrier channel (3) with a low impedance current input (6) connected in series with the variable charge carrier channel (3) for reducing the influence of the phase inverted transmission signal voltage (S1.1) superimposed on the control voltage signal $U_{st}$, responsive to the amplitude controlled phase inverted current signal (i1), for providing an amplitude controlled phase inverter transmission voltage signal (S1.2);

c) a second signal path circuit (2) being connected in parallel to and having substantially identical components as the first signal path (1), having corresponding semiconductor means (4') with a corresponding single variable charge carrier channel (3'), and a corresponding control electrode input (14') connected in parallel with the control electrode input (14) of the first signal path circuit (1) to a common control input (15), responsive to the non-phase inverted transmission voltage signal (S2.1), for providing an amplitude controlled non-phase inverted current signal (i2), also having a corresponding current-to-voltage converter circuit (7') arranged downstream of the corresponding variable charge carrier channel (3') with corresponding low impedance current input (6') connected in series with the corresponding variable charge carrier channel (3') for reducing the influence of the non-phase inverted transmission voltage signal (S2.1) superimposed on the control voltage signal $U_{st}$, responsive to the amplitude controlled non-phase inverted current signal (i2), for providing an amplitude controlled non-phase inverted transmission voltage signal (S2.2), said first signal path circuit (1) and said second signal path circuit (2) having phase inversions with a substantially equal level and delay time; and (d) means (13) for combining the amplitude controlled phase inverted transmission voltage signal (S1.2) and the amplitude controlled non-phase inverted transmission voltage signal (S2.2), for providing a transmission output signal (So);

wherein the inverter/noninverter circuit means (10, 25) comprises a first phase inverter (25) arranged in the first signal path circuit (1) before the input electrode (20) of the charge carrier channel (3), for providing the phase inverted transmission voltage signal (S1.1), and further comprises a second phase inverter (26) arranged in the second signal path (2) downstream of the charge carrier channel (3') connected with an adder circuit (24) that forms the means (13) for combining the amplitude controlled phase inverted transmission voltage signal (S1.2) and the amplitude controlled non-phase inverted transmission voltage signal (S2.2).

* * * * *